United States Patent [19]

West et al.

[11] Patent Number: 5,212,443

[45] Date of Patent: May 18, 1993

[54] EVENT SEQUENCER FOR AUTOMATIC TEST EQUIPMENT

[75] Inventors: Burnell West, Fremont; Egbert Graeve, Los Altos, both of Calif.

[73] Assignee: Schlumberger Technologies, Inc., San Jose, Calif.

[21] Appl. No.: 577,986

[22] Filed: Sep. 5, 1990

[51] Int. Cl.[5] .............................................. G01R 31/28
[52] U.S. Cl. ................................ 324/158 R; 324/73.1;
                                                      371/15.1
[58] Field of Search ......................... 324/73.1, 158 R;
           371/15.1, 25.1, 27, 22.1, 22.2, 22.6; 437/8;
                                                307/303, 303.1

[56] References Cited

U.S. PATENT DOCUMENTS

| | | | |
|---|---|---|---|
| 4,354,268 | 10/1982 | Michel et al. | 324/73.1 |
| 4,639,919 | 1/1987 | Chang et al. | 371/27 |
| 4,642,561 | 2/1987 | Groves et al. | 371/27 |
| 4,646,299 | 2/1987 | Schinabeck et al. | 324/73.1 |
| 4,682,330 | 7/1987 | Millhaus | 371/27 |
| 4,928,278 | 5/1990 | Otsuji et al. | 371/25.1 |
| 4,931,723 | 6/1990 | Jeffrey et al. | 371/25.1 |

FOREIGN PATENT DOCUMENTS

2214314 8/1989 United Kingdom ............... 324/73.1

*Primary Examiner*—Vinh P. Nguyen
*Attorney, Agent, or Firm*—Townsend and Townsend Khourie and Crew

[57] ABSTRACT

A number of local sequencers, one for each pin of the device under test is disclosed. Each local sequencer is provided with a global clock, a global time zero signal indicating the clock edge for referencing the start of a test, and a period vernier indicating an offset from the clock for the start of the test period. Each local sequencer uses this information to generate its own test events referenced to the test period with individual calibration delays factored in locally. Each local sequencer is individually programmable so that different sequencers can provide different numbers of events during the same test period.

19 Claims, 5 Drawing Sheets

EVENT SEQUENCER FOR AUTOMATIC TEST EQUIPMENT

BACKGROUND

The present invention relates to automatic test equipment for testing integrated electronic circuits, and more particularly to such systems using a processor per pin architecture.

As the complexity and pin count of VLSI integrated circuits have exploded, test program generation has become immensely more complicated. VLSI semiconductor manufacturers are using the data from the simulation of these complex IC's to generate timing information and test vectors for the test program. In most cases either the input data to, or output data from the simulator must be modified, before timing and test vectors can be generated with this simulation data. This is primarily due to the difference in the technique in which the simulator and test systems handle waveform generation.

Timing/logic simulators work with transitions in the input and output waveforms to the IC which are called events (i.e., event driven simulation). Test systems generate waveforms by trying to fit a certain format around these transitions and then programming the time at which these transitions are to occur with edges from a timing generator. The IC simulation is not restricted to using formats or limiting the number of transitions that occur in a period of time. Often a simulation will contain waveforms that the test system can not produce. One solution is to perform a special simulation in which the input data to the simulator has been modified so that the simulation will not contain waveforms that cannot be produced on the test system. Another approach is to modify the simulation output t make the data fit the test system. Modifying the input or output of the simulation has several negative effects:

Increases test program generation time.
Reduces the accuracy of the test by diverging from the intent of the simulation.
Increases debug time if modifications to the simulation output create errors.

When digital functional automatic test equipment first became popular in the latter part of the 60's, its architecture was very straightforward. Latches written by controllers formed the stimulus for the device under test, and comparators on the outputs would verify the device response. Each succeeding digital functional test consists of the following sequence of events:

Establish the device inputs.
Wait for the device to respond.
Check the device outputs.

For each device pin, at any given instant in time at most one of the following state changes can occur:

Drive to HIGH
Drive to LOW
Drive OFF
Begin Test for HIGH
Begin Test for LOW
Begin Test for Z-State
End Test Complexity arises because different pins require different sequences of events, and the timing at which the state changes are to occur will in general vary from pin to pin.

Test system architectures in the sixties and seventies evolved to minimize the hardware required to effectively produce large sequences of pin events. The principal architectural innovation of that period was the separation of functional data from timing, resulting in the development of very deep pattern memory applied with shared timing generators (TG's). The functional data appeared as tables of 1's and 0's (test vectors). Very effective functional tests could be produced for complex devices with just a few timing generators connected to pattern data by multiplexers and formatters. But this architectural construction, effective as it was at that time, introduced difficulties of its own. As devices become more complex, the process of parsing the test requirement into the pattern table and the timing became increasingly difficult. Limited numbers of timing resources inevitably imposed increasingly stringent restrictions on their use. The translation from the simulator output to the test program became increasingly more obscure and problematical. At the same time, device speeds dramatically increased, which made test margins ever more difficult to obtain. Pin skew and timing generator distribution skew began to dominate tester performance considerations.

During the last decade, TG-per-pin test systems were introduced to help alleviate some of these problems. As more and more resources are applied independently to each of the device pins, fewer and fewer machine restrictions are imposed on the functional test program. But simply applying a TG per pin does not eliminate the translation problem. The need to modify the simulation data exists regardless of whether the test system has shared resource timing or TG-per-pin timing architecture. The TG-per-pin architecture allows the flexibility to generate independent waveforms on every device pin, but still restricts the waveforms with tester oriented formats and limited transitions. Furthermore, many of the available TG-per-pin systems do not provide calibrated edge placement on all functions. Thus manual changes to the timing are still required to get adequate yields.

SUMMARY OF THE INVENTION

The present invention provides a number of local sequencers, one for each pin of the device under test. Each local sequencer is provided with a global clock, a global time zero signal indicating the clock edge for referencing the start of a test, and a period vernier indicating an offset from the clock for the start of the test period. Each local sequencer uses this information to generate its own test events referenced to the test period with individual calibration delays factored in locally. Each local sequencer is individually programmable so that different sequencers can provide different numbers of events during the same test period.

Each local sequencer uses the time zero signal to indicate the appropriate clock edge for the start of a test period, and offsets this by adding the value corresponding to the global period vernier. In addition, a calibration offset is added to account for the propagation delays for that particular sequencer and its device pin. The calibration delay will vary according to the particular type of event being provided during the test.

Each local sequencer has two memories, one for storing events (a time for a transition and state which is arrived at after the transition) and one for storing functional data. The event memory can either store the state directly, or refer to the functional data in the separate memory. By separating the two, more flexibility is provided in programming the sequencer. Existing functional databases can be used without change. In addition, instead of using a separate bit or bits for each state for each time, a few bits can indicate a particular pattern to be repeated, with only the times of the transitions needing to be stored. Thus, the amount of memory required for the functional data may be reduced.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
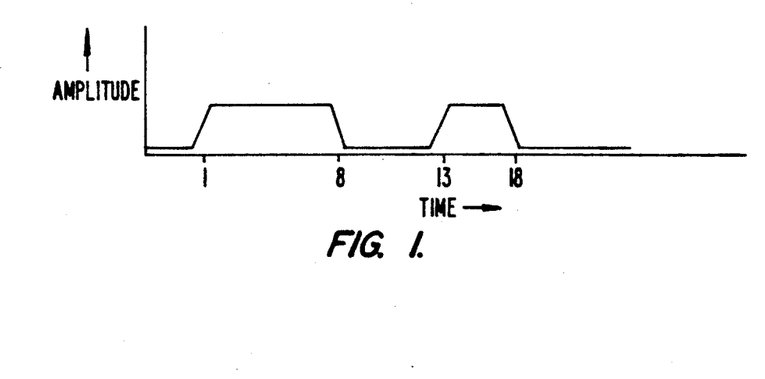
FIG. 1 is a diagram illustrating an event sequence.

FIG. 1 illustrates an "event sequence" as the term is used herein. An "event" is a pair (S, T) where "S" is a state and "T" is the time associated with the transition to S. An "event sequence" is a time-ordered list of such pairs. For example, in the waveform shown in FIG. 1, the event sequence has four events which can be written as (D1, 1), (D0, 8), (D1, 13), and (D0, 18). The first event is driving the signal to a high state (1) at time =1. The second event is driving the signal to a low state (0) at time =8. The third event is driving to a high at T=13 and the fourth event is driving to a low at T=18.

Figure 2:
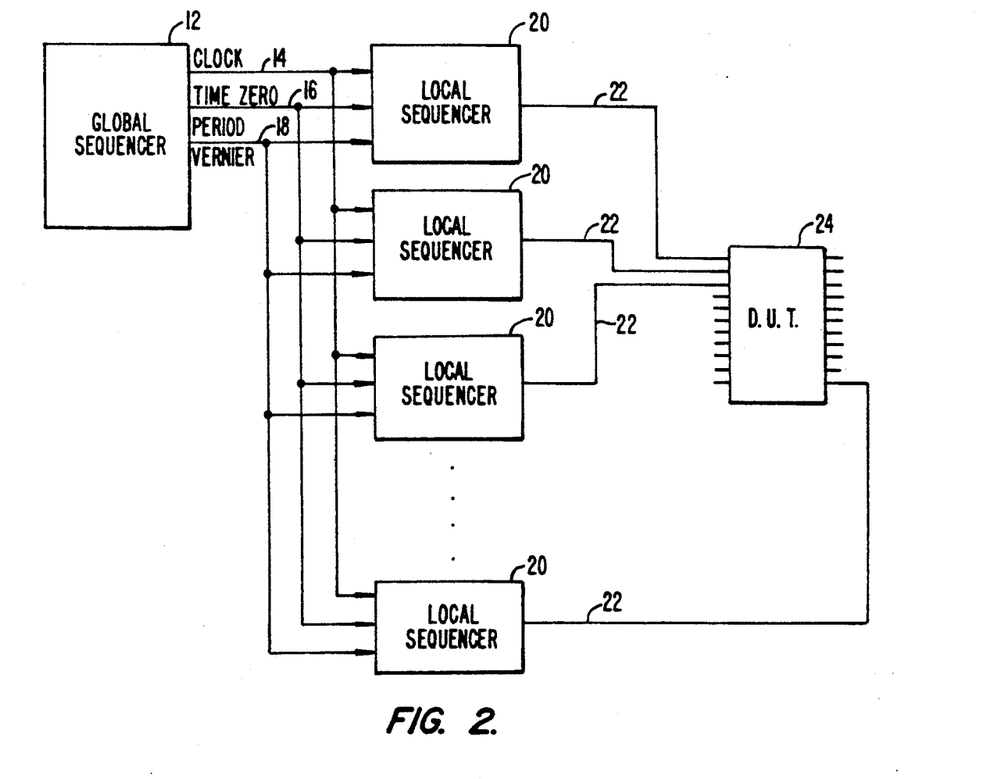
FIG. 2 is an overall block diagram of a system according to the present invention.

FIG. 2 is a block diagram of a test system according to the present invention. A global sequencer 12 produces a clock signal on a line 14 and a time zero signal on one of lines 16. A strobe time zero signal is produced on another of lines 16 for comparing an output of the device under test (DUT) 24. Multiple time zero and strobe time zero signals can be used to asynchronously test different portions of the DUT. The time zero signal is a particular clock pulse edge to which a test period is to be referenced. A number of digital bits are provided on lines 18 to indicate an offset from the time zero signal for the actual beginning of the test period. All of these signals are provided to a number of local sequencers 20. Each local sequencer has an I/O line 22 coupled to a separate pin of DUT 24.

Figure 3:
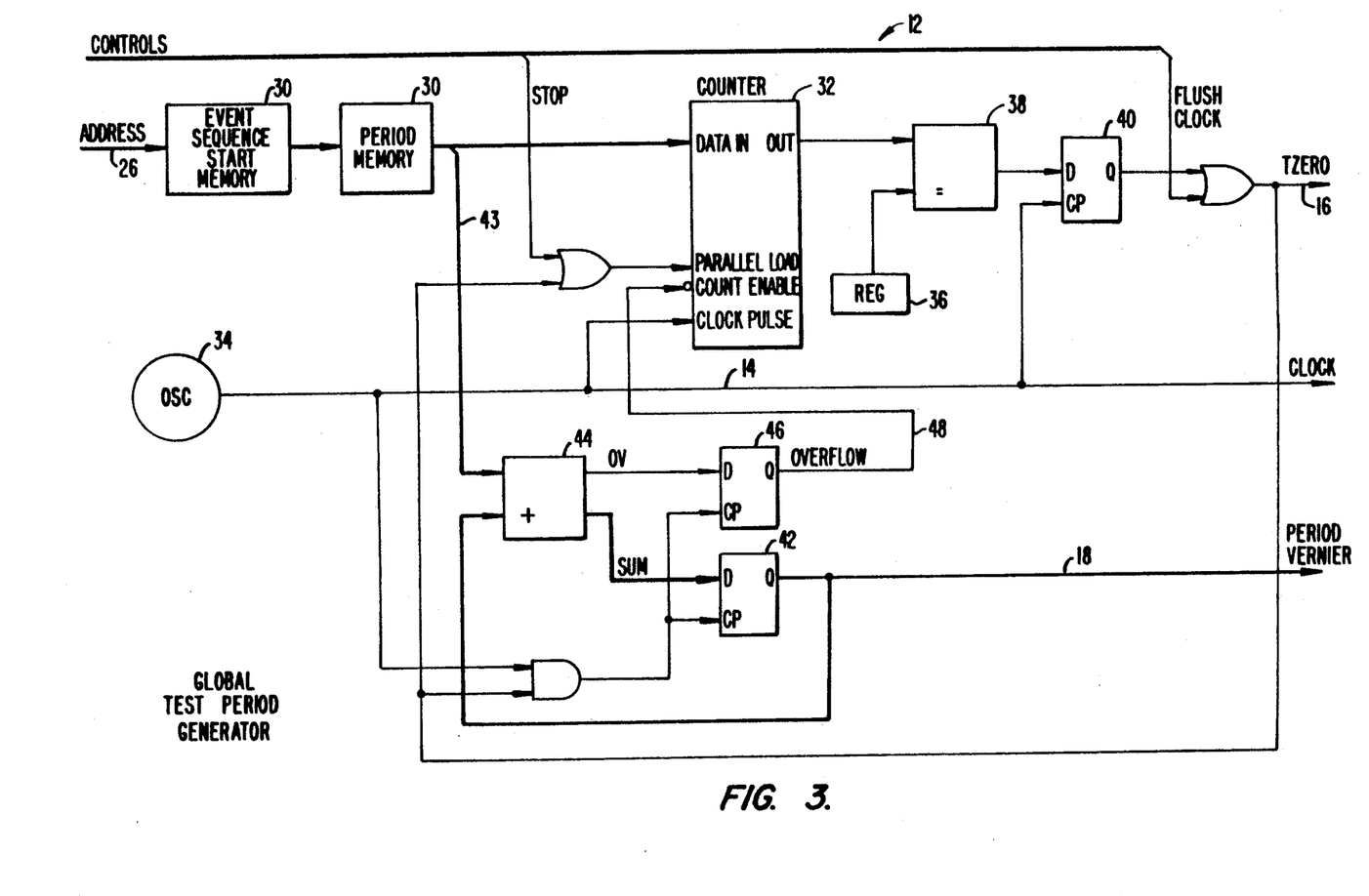
FIG. 3 is a block diagram of the global sequencer of FIG. 2.

FIG. 3 is a diagram of global sequencer 12 of FIG. 2. An input address on a bus 26 is provided to an SRAM 28. The output of SRAM 28 is provided to another memory 30 to provide a level of indirection for flexibility and ease of programming. The output of memory 30 is provided as a data input to a counter 32, which is sequenced by the clock signal on clock line 14 from an oscillator 34. The data input is used to preset the counter to a desired value. When the output of counter 32 reaches a predetermined value stored in a register 36, an output will be provided from a comparator 38. The output of comparator 38 is provided through a latch 40 to provide a time zero signal 16, indicating the start of a test event. This time zero signal will be periodically generated from counter 32.

The global period offset, or period vernier, which is referenced from the time zero signal is generated by a latch 42 on period vernier lines 18. The original offset value is provided from memory 30 on lines 43 through adder 44 to latch 42. The output 18 is fed back to an adder 44, where it is summed with the original bits 43 from memory 30 to produce sum and overflow values. The sum value is provided back to latch 42 to provide the next period vernier offset (after the next time zero signal), while the overflow value is provided through a latch 46 to given an overflow output on a line 48 which is provided as an input to counter 32. This adds a clock cycle increment to the counter when the amount of the offset equals a clock cycle. The strobe time zero signal is generated by delaying the time zero signal by an amount equal to the signal round trip time from the test system to the DUT.

Figure 4:
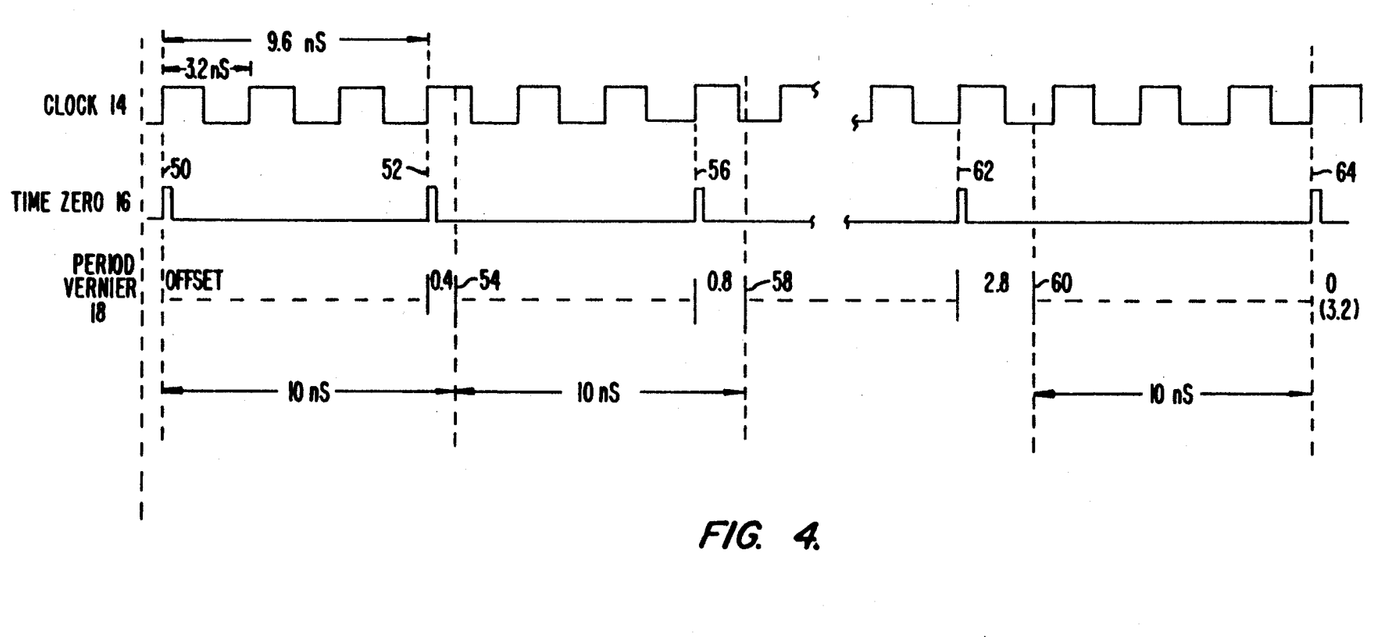
FIG. 4 is a timing diagram illustrating the timing signals generated by the global sequencer of FIG. 3.

The signals generated by the circuit of FIG. 3 are illustrated in FIG. 4. In the example shown, there is a clock signal 14 having a period of 3.2 nanoseconds (ns). This corresponds to a frequency of 312.5 megahertz (MHz). By way of example, it may be desirable to have a test period of 10 ns. It can be seen that 3 clock cycles will provide a period of 9.6 ns, while 4 clock cycles will provide a period of 12.8 ns. A typical prior art method for providing the desired period is to modify the clock period itself.

The present invention can provide a 10 ns clock period without modifying the clock. In the example shown in FIG. 5, a time zero signal is generated at a time 50. This indicates the start of the test period. A second time zero signal is generated at a time 52, corresponding to a rising edge of clock signal 14 at 9.6 ns. Since this is not quite 10 ns, a digital value indicating 0.4 ns is provided as a period vernier offset 18. Each local sequencer will then use this value to determine the actual start of the next test period at a time 54, which is 10 ns from time 50.

Similarly, a next time zero signal is produced at a time 56, this time requiring an offset of 0.8 ns to produce the 10 ns period at time 58. This process continues until the offset value becomes 2.8 to produce a test period starting at time 60. When this 2.8 value is fed back through adder 44 shown in FIG. 3, there will be an overflow value since the next increment of 0.4 will produce a value of 3.2, which is equal to the test period. Thus, on the next period, instead of producing an offset value of 3.2, the counter is simply incremented an additional value so that there are four clock pulses between the time zero signal at time 62 and the next one at time 64. At this point, there is no offset value applied since the beginning of the test period is again aligned with the rising edge of the clock pulse. As can be seen, this gives the ability to provide a test period resolution which is not limited to the resolution of the clock.

Figure 5:
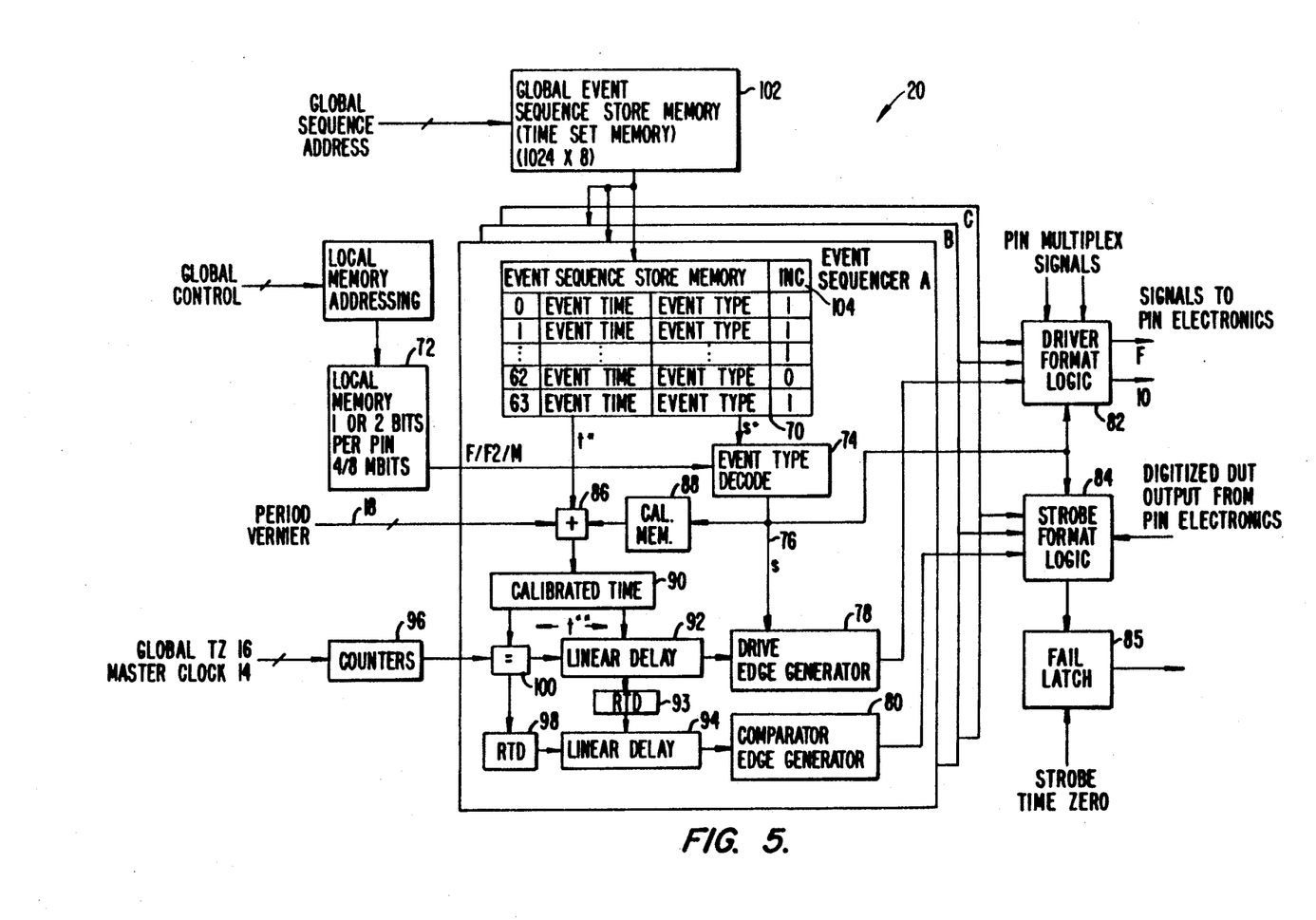
FIG. 5 is a block diagram of a local sequencer of FIG. 2.

FIG. 5 is a diagram of the local sequencer 20 of FIG. 2. Two different memories are used, an event sequence store memory 70 and a local memory 72. Memory 70 stores an event type for each event which indicates the state of the event and the control information (drive a value to the DUT or test the value coming from the DUT, or turn off the driver or tester). The actual state can be provided in the event type, or can be specified as functional data coming from local memory 22. An event type decoder 74 takes the information from the two memories and provides it on control lines 76 to various elements. This allows the data in local memory 72, called the functional data, to be separated out. As discussed above in the background, functional data was used in prior art systems which shared a timing generator. Thus, a different set of functional data was derived for each pin to be provided to the shared timing generator. This invention allows such functional databases to be used unchanged by loading them in to the local memory. In addition, several different patterns of functional data could be applied without modifying the event type designations stored in event sequence store memory 70. Ultimately, the functional data could be ignored or eliminated with the event types specifying all the information. Thus, the configuration gives the maximum flexibility.

In the current embodiment, the event types stored in memory 70 may be any of the following:

D0—Drive a 0
D1—Drive a 1.
DF—Drive 1st bit LM
DF2—Drive 2nd bit LM data
DF_—Drive 1st LM data complement
DF2_—Drive 2nd bit LM data complement
DZ—Turn drive off
T0—Test for a 0
T1—Test for a 1
TF—Test for 1st bit LM data
TF2—Test for 2nd bit LM data
TF_—Test for 1st LM data complement
TF2_—Test for 2nd bit LM data complement
TZ—Test for high impedance Alternative lists of events could be used. The designation "LM" refers to the local memory 72. Either 1 or 2 bits per pin could be stored in local memory 72 for each event. In other embodiments of the present invention, 4, 8 or more bits per pin could be stored in memory for each event.

The local memory has a depth of 4 megabits per pin and this may be optionally expanded to 32 megabits. The local memory can be used in a 1 bit or 2 bit per pin per vector (state) mode. The 2 bit per pin mode can be used for presenting 2 bits of functional data to a pin in a cycle such as required by an I/0 pin where the data driven to the DUT is different from the DUT output data. The second bit may also be used as a mask bit for devices that require a large combination of "care" and "don't care" pins in different cycles, such as are frequently found on ASIC simulations vectors.

The output of event type decode 70 is an event type S which is one of the seven event types specified in the background section above. These are:

Drive to high.
Drive to low.
Drive off.
Begin test for high.
Begin test for low.
Begin test for Z-state.
End test.

This event type is provided as a control input to a drive edge generator 78 and a comparator edge generator 80. These generators provide signals to driver format logic 82 and strobe format logic 84, respectively. Where the DUT is to be driven to, driver format logic 82 will be active. When an output from the DUT is to be compared to a value, strobe format logic 84 will be activated.

In addition to the event, the timing for the occurrence for each event must be provided for. The time from memory 70 is provided to an adder 86. A separate input to the adder is period vernier lines 18. Finally, an input to the adder is provided from a calibration memory 88.

The calibration memory is addressed by the event type S on lines 76. Each event has its own time value. This value is always added to the same period vernier.

The event type S is converted in the Event Type Decoder to one of the original seven types. This event type S controls the selection of the calibration offset, which is used to compensate for inevitable path length and circuit performance differences. To minimize skew from various state transitions, the calibration store contains values for different starting states. For example, the calibration offset associated with D1 from Z is different from that associated with D1 from 0.

Since each pin has a memory to store unique calibration values for each event type, the event is calibrated "on the fly", as it is used. This allows the system to be calibrated with no more than 17 ps of skew between pins.

The calibrated time from adder 86 is stored in a calibrated time register 90. From there it is provided to linear delay circuits 92 and 94, respectively and to comparator 100. Delay circuit 92 provides the delay corresponding to the offset from the time zero signal to drive edge generator 78. Linear delay circuit 94 similarly provides a delay for a test comparison signal generated by comparator edge generator 80. The global time zero signal 16 and master clock 14 are provided through four counters 96. Four counters are provided to be able to count an amount of time longer than a period and provide enough overlap for a 100 MHz test. Each successive time zero signal resets one of the four counters in a round robin fashion. Each counter counts the master clock over four periods, providing the opportunity to specify a time value much larger than a period. The overlap is required at 100 MHz because the delay through the device under test can exceed a period.

For the test mode, round trip delay (RTD) circuits 93 and 98 are also provided to make allowance for the time the signals require to go to the DUT and back. When a signal is being driven to the DUT and linear delay circuit 92 is used, the output of counters 96 is provided through a comparator 100, which determines when the count corresponding to the time provided from register 90 has been reached.

Each local sequencer 20 can store a sequence of 192 events. These may be segmented up to 64 times to give 64 different event sequences per pin. Event sequences are defined on a per pin basis and each pin's event sequences are independent of those on any other pin. This gives the flexibility for 1 pin to have only a single event sequence with 192 events, while another pin could have 64 different sequences with 1, 2, or 3 events each. A global event sequence memory 102 chooses which event sequence to use of the 64 available in memory 70.

An increment bit field 104 in memory 70 is used to indicate whether there are more events in a sequence or whether this event is the last event. For example, if there is another event following, the increment field will have a 1 bit, while if it is the last event in a sequence or the only event in a sequence, there will be a 0 bit in the increment field.

Each local sequencer has three event sequencers designated A, B and C in FIG. 5. The three outputs are provided to driver format logic 82 and, after a round trip delay, strobe format logic 84, and are ORed together in those logic circuits. By the use of three separate event generators, a much faster event rate can be generated. This is done by offsetting one event sequencer from the other by a slight amount which is less than the amount of time it would take for one generator to generate subsequent back-to-back events. Thus, one of the event sequencers can be loading while the other is outputting.

A latch 95 collects the fail data, and provides it to an output when strobed by the strobe time zero signal.

In another mode, called the pin multiplex mode, two different pins may have their outputs multiplexed together. This is done on the drive side by a logical OR gate contained in the driver format logic 82. On the strobe side, the DUT's output is directed to both pin circuits and strobed independently. Each pair of event sequencer channels may use the pin multiplex mode independently of any other pair of channels.

In a pulse mode, the data rate can be doubled since only one timing event indication is needed to provide both the rising and falling edges. In this mode, a pre-specified pulse width is used with each event triggering a transition to a state and then back again after the pulse width. This can be done with return-to-zero (RTZ) or return-to-one (RTO) pulses.

Figures 6, 7:
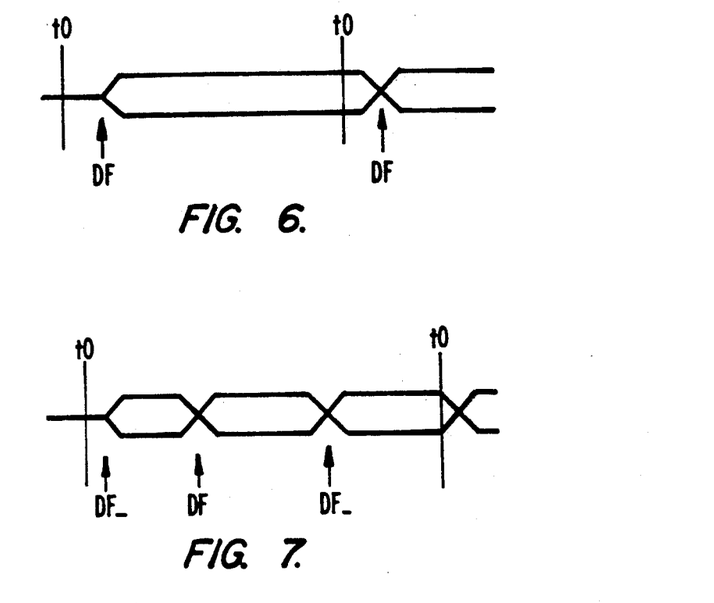
FIGS. 6-9 are diagrams of different waveforms which can be generated by the present invention.

The architecture makes programming complex waveforms very simple. The user only needs to define the type of event and the time at which the event is to occur. Waveform formats that were used on the previous generation of ATEs are easily generated using the event sequence concept. For example, NRZ (Non-return-to-zero) format is specified by programming one event as follows:

This statement directs the hardware to drive to the current vector's data at 1nS. FIG. 6 is a graphical display of the NRZ waveform.

SBC (Surround By Complement) format is specified by programming the following sequence of events as illustrated in FIG. 7.

DF_@2ns
DF@11 ns
DF_@22 ns

This shows the ease with which other ATE architecture test programs may be ported to the architecture of the present invention.

Figure 8:
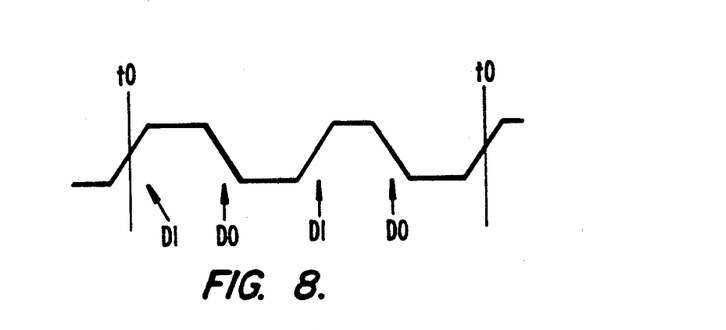

A clock pin can be generated with no local memory data by programming the following sequence of events, as shown in FIG. 8:

D1@0 ns
D0@4 ns
D1@8 ns
D0@10 ns

Different event sequences may be used to change the number of clocks that occur in a cycle and the placement of the clock transitions. More complex control pin sequences can also be programmed without the use of functional data tables at all. As a consequence, actual data pattern storage can be well below one bit per pin per vector, reducing the demand on pattern storage space and load times.

Figure 9:
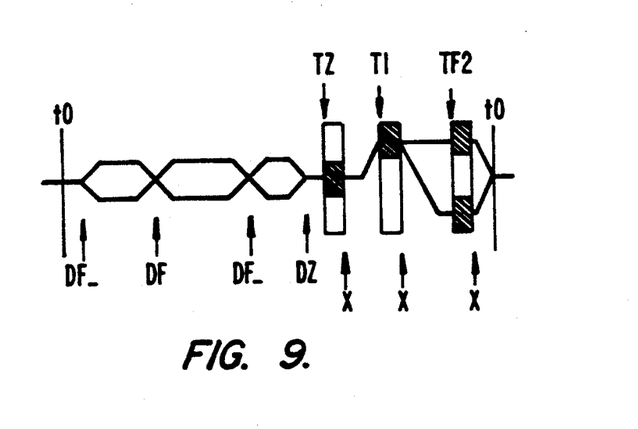

Below is an example of waveform generation for an I/0 cycle with the DUT pin being driven with a surround by complement (SBC) waveform, then the driver being turned off and the output being strobed first for tri-state, then a 1, and then local memory data which is different from the drive data. FIG. 9 shows a graphical drawing of this sequence of events:

DF_@2 ns—Drive functional data complement
DF@9 ns—Drive functional data
DF_@18 ns—Drive functional data complement
DZ@22 ns—Turn driver off
TZ@24 ns—Test for Tri-state
X@26 ns—Turn window strobe off
T1@32 ns—Test for a 1
X@34 ns—Turn window strobe off
TF2@40 ns—Test for 2nd functional data
X@42 ns—Turn window strobe off Complex waveforms such as this are not possible on test systems with shared resource or TG-per-pin architectures. This example used 10 events and the preferred embodiment of the present invention could generate up to 192 events in one cycle. The ability to have two bits of functional data in each cycle allows this architecture to drive one set of data and test for a different set in the same cycle. This is done without using a mux mode which would reduce the pin count of the test system. Being able to place an event with 12.5 ps resolution and anywhere across 4 cycles, gives the architecture even more waveform generation and strobe placement flexibility. The placement across 4 cycles is accomplished using the 4 counters 96 discussed earlier. This type of flexibility makes generating timing statements and test vectors from simulation data fast, easy, and accurate. Eliminating the need to make the simulation fit the test system will improve the time to generate new test programs, generate better tests that follow the intent of the simulation, and decrease the amount of time to debug a new test program.

As will be understood by those familiar wit the art, the present invention may be embodied in other specific forms without departing from the spirit or the essential characteristics thereof. For example, the calibration values could be part of the event sequencer memory. The number of sequencers (A, B or C) could be expanded to increase the data rate further. The event time could be a time from the last event (delta time) rather than the time from the start of a period, with an additional adder to relate that delta time to the start of a period. More bits of functional data (4, 8, 16, etc.) could be provided at the start of each period.

Accordingly, the disclosure of the present invention is intended to be illustrative, but not limiting, of the scope of the invention which is set forth in the following claims.

What is claimed is:

1. A test system for testing an integrated circuit by providing test signals to one or more leads of said integrated circuit, comprising:
   (a) a global sequencer including
      a clock signal generator for generating a clock signal,
   means for generating a time zero signal using said clock signal to indicate the start of a test sequence, and
      means for generating a period vernier value indicating an offset form said clock signal for the start of each of a plurality of test cycles in said test sequence; and
   (b) a plurality of local sequencers, each of said local sequencers being coupled to a separate one of said leads of said integrated circuit, each said local sequencer being responsive to said clock signal and said period vernier value for generating an edge in a signal for one of said leads within one of said test cycles defined by said period vernier value in said test sequence, such that said test cycle need not be a multiple of said clock signal.

2. A test system for testing an electronic circuit having a plurality of leads, comprising:
   (a) a global sequencer including means for generating a global clock signal;

means for generating, using said global clock signal, a global time zero signal indicating the beginning of a test period;

means coupled to said means for generating a global clock signal for generating a global strobe time zero signal to establish a time for collecting data at the end of said test period; and (b) a plurality of local sequencer, each local sequencer being coupled to one of said leads, each local sequencer generating, in said test period, a programmable number of signal transitions of a test signal to said lead;

said local sequencers being programmable with said number of signal transitions for said plurality of local sequencers such that said local sequencers can have different numbers of transitions in any given test period; and means, in each of said local sequencers, for providing data form said lead in response to said global strobe time zero signal.

3. The test system of claim 2 further comprising:

second means for generating a second global time zero signal coupled to said local sequencers; and second means for generating a second global strobe time zero signal coupled to said means for providing data;

such that separate groups of said local sequencers can receive separate global time zero and global strobe time zero signals to asynchronously and independently test different groups of said leads of said circuit.

4. A local sequencer for a test system, said test system having a plurality of said local sequencers, each local sequencer being coupled to a lead of a device under test, said local sequencer comprising:

memory means for storing the time and type of events applied to and received from said device under test and for storing offsets for said time according to said event type;

adder means for adding said time from said memory, one of said offsets and an externally provided global test period offset to provide a calibrated time;

means for delaying an external clock signal by said calibrated time to produce a delayed clock signal; and edge generator means, coupled to said means for delaying, for producing a test signal transition for said lead at a time indicated by said delayed clock signal.

5. The local sequencer of claim 4 wherein said memory means comprises a functional memory for storing event types, a local memory for storing event times and a calibration memory for storing said offsets.

6. The local sequencer of claim 5 wherein said local memory also stores one of (a) an event type and (b) a reference to said functional memory for a plurality of event times.

7. The local sequencer of claim 6 further comprising event type decode logic having inputs coupled to said functional memory and said local memory and an output coupled to said calibration memory.

8. The local sequencer of claim 6 wherein said local memory also stores for each event time a flag indicating whether said event is the last event in a sequence of events.

9. The local sequencer of claim 5 wherein said event time is defined as the time since a last event.

10. The local sequencer of claim 4 further comprising a register coupled to the output of said adder for storing said calibrated time, and wherein said means for delaying includes a linear delay circuit having an input coupled to an output of said register.

11. A sequencer for providing test signals to a circuit being tested, comprising:

memory means for storing timing data indicating the time for each of a sequence of signal transitions and functional data indicating the state to be transitioned to for said sequence, wherein a bit of said functional data can apply to a plurality of signal transitions;

decoding means, coupled to said memory means, having a first input coupled to receive said timing data and a second input coupled to receive said functional data, for providing an output indicating the state and transition time of event signals; and driver means, coupled to said decoding means, for providing said event signals to said circuit being tested.

12. The sequencer of claim 11 wherein said memory means comprises a functional memory for storing functional data, a local memory for storing said timing data and a calibration memory for storing offsets for said timing data according to said functional data.

13. The sequencer of claim 12 wherein said local memory also stores, for a plurality of event times, one of (a) functional data and (b) a reference to said functional memory.

14. The sequencer of claim 13 wherein said decoding means comprises event type decode logic having inputs coupled to said functional memory and said local memory and an output coupled to said calibration memory.

15. The sequencer of claim 13 wherein said local memory also stores for each event time a flag indicating whether said event is in the last event in a sequence of events.

16. A test system for testing an integrated circuit, comprising:

(a) a global sequencer including
a clock signal generator for generating a clock signal,
means for generating a time zero signal using said clock signal to indicate the start of a test sequence,
means for generating a period vernier value indicating an offset from said clock signal for the start of each of a plurality of test cycles in said test sequence; and a plurality of local sequencers, each of said local sequencers being coupled to a separate lead of said integrated circuit, for generating, in a test period calibrated to said clock signal, a programmable number of signal transitions, such that said local sequencers can have different numbers of transitions in any given test period, each local sequencer including edge generator means, responsive to said clock signal and said period vernier value, for generating one of said signal transitions in a signal for said lead within a test cycle defined by said period vernier value, such that said test cycle need not be a multiple of said clock signal.

17. A test system for testing an integrated circuit, comprising:

a global sequencer including
  a clock signal generator for generating a clock signal,
  means for generating a time zero signal using said clock signal to indicate the start of a test sequence,
  means for generating a period vernier value indicating an offset from said clock signal for the start of each of a plurality of test cycles in said test sequence; and
a plurality of local sequencers, each of said local sequencers being coupled to a separate lead of said integrated circuit, each local sequencer including
  memory means for storing timing data indicating the time for each of a sequence of signal transitions and functional data indicating the state to be transitioned to for said sequence, wherein a bit of said functional data can apply to a plurality of signal transitions,
  decoding means, having a first input coupled to receive said timing data and a second input coupled to receive said functional data, for providing an output indicating the state and transition time of events,
  edge generator means, coupled to said decoding means and responsive to said clock signal, said period vernier value and said state and transition time of events, for generating an edge in a signal for said lead within a test cycle defined by said period vernier value, such that said test cycle need not be a multiple of said clock signal, and
  driver means, coupled to said edge generator means, for providing said edges to said leads of said integrated circuit.

18. A test system for testing an integrated circuit, comprising:
a global sequencer including
  a clock signal generator for generating a clock signal,
  means for generating a time zero signal using said clock signal to indicate the start of a test sequence,
  means for generating a period vernier value indicating an offset from said clock signal for the start of each of a plurality of test cycles; and
a plurality of local sequencers, each of said local sequencers being coupled to a separate lead of said integrated circuit, each local sequencer including
  memory means for storing timing data indicating the time for each of a sequence of signal transitions and functional data indicating the state to be transitioned to for said sequence, wherein a bit of said functional data can apply to a plurality of signal transitions;
  decoding means, having a first input coupled to receive said timing data and a second input coupled to receive said functional data, for providing an output indicating the state and transition time of events;
  edge generator means, coupled to said decoding means and responsive to said clock signal, said period vernier value and said state and transition time of events for generating a programmable number of signal transitions in a signal for said lead within a test cycle defined by said period vernier value, such that said test cycle need not be a multiple of said clock signal and said local sequencers can have different numbers of transitions in any given test period, and
  driver means, coupled to said edge generator means, for providing said signal transitions to said circuit.

19. A local sequencer for a test system having a plurality of said local sequencers, each local sequencer being coupled to a lead of a device under test, comprising:
  a functional memory for storing event types;
  a local memory for storing event times, one of (a) an event type and (b) a reference to said functional memory for every event time, and a flag indicating whether said event is the last event in a sequence of events;
  a calibration memory for storing offsets for said event times according to said event type;
  event type decode logic having inputs coupled to said functional memory and said local memory and an output coupled to said calibration memory;
  adder means for adding said time from said memory, one of said offsets and an externally provided global test period offset to provide a calibrated time;
  means for delaying an external clock signal by said calibrated time to produce a delayed clock signal; and
  edge generator means, coupled to said means for delaying, for producing a test signal transition to said lead at a time indicated by said delayed clock signal.

* * * * *